(12) United States Patent
Spirkl et al.

(10) Patent No.: US 7,437,629 B2
(45) Date of Patent: Oct. 14, 2008

(54) METHOD FOR CHECKING THE REFRESH FUNCTION OF AN INFORMATION MEMORY

(75) Inventors: Wolfgang Spirkl, Germering (DE); Detlev Richter, München (DE)

(73) Assignee: Infineon Technologies AG, Munich (DE)

( * ) Notice: Subject to any disclaimer, the term of this patent is extended or adjusted under 35 U.S.C. 154(b) by 1268 days.

(21) Appl. No.: 10/607,518

(22) Filed: Jun. 26, 2003

(65) Prior Publication Data

US 2004/0008559 A1 Jan. 15, 2004

(30) Foreign Application Priority Data

Jun. 26, 2002 (DE) ................................ 102 28 527

(51) Int. Cl.
*G11C 29/00* (2006.01)

(52) U.S. Cl. .............................. 714/718; 714/5; 714/42; 714/719; 714/721; 714/731; 714/742; 714/744; 714/745; 714/815; 365/201

(58) Field of Classification Search ........................ None
See application file for complete search history.

(56) References Cited

U.S. PATENT DOCUMENTS

| | | | | |
|---|---|---|---|---|
| 4,622,668 A | * | 11/1986 | Dancker et al. ................ 714/42 |
| 4,672,583 A | * | 6/1987 | Nakaizumi ................... 365/222 |
| 5,299,168 A | * | 3/1994 | Kang ........................... 365/222 |
| 5,625,597 A | * | 4/1997 | Hirose ......................... 365/201 |
| 5,914,902 A | * | 6/1999 | Lawrence et al. ............ 365/201 |
| 6,246,619 B1 | * | 6/2001 | Ematrudo et al. ............ 365/201 |
| 6,295,238 B1 | * | 9/2001 | Tanizaki et al. .............. 365/201 |
| 6,392,948 B1 | | 5/2002 | Lee |
| 6,501,693 B2 | * | 12/2002 | Takatsuka et al. ........... 365/201 |
| 6,614,704 B2 | * | 9/2003 | Dobler et al. ................ 365/222 |
| 6,614,713 B2 | * | 9/2003 | Tanizaki et al. .......... 365/233.1 |
| 6,754,127 B2 | * | 6/2004 | Ooishi ......................... 365/222 |
| 6,762,967 B2 | * | 7/2004 | Tanizaki et al. .............. 365/201 |
| 2001/0027541 A1 | | 10/2001 | Richter et al. |
| 2002/0176295 A1 | * | 11/2002 | Takatsuka et al. ........... 365/201 |

FOREIGN PATENT DOCUMENTS

DE 100 04 958 A1 8/2001

* cited by examiner

*Primary Examiner*—John P Trimmings
(74) *Attorney, Agent, or Firm*—Laurence A. Greenberg; Werner H. Stemer; Ralph E. Locher

(57) ABSTRACT

A method for checking the refresh function of a memory having a refresh device includes the steps of, first, ascertaining whether or not refresh request pulses are being produced on the information memory and, if so, at what intervals of time from one another these refresh request pulses are produced. Next, a control unit for the information memory is supplied with refresh test pulses produced outside of the information memory instead of being supplied with the refresh request pulses. Then, the refresh test pulses are used to check a refresh device situated on the information memory.

8 Claims, 1 Drawing Sheet

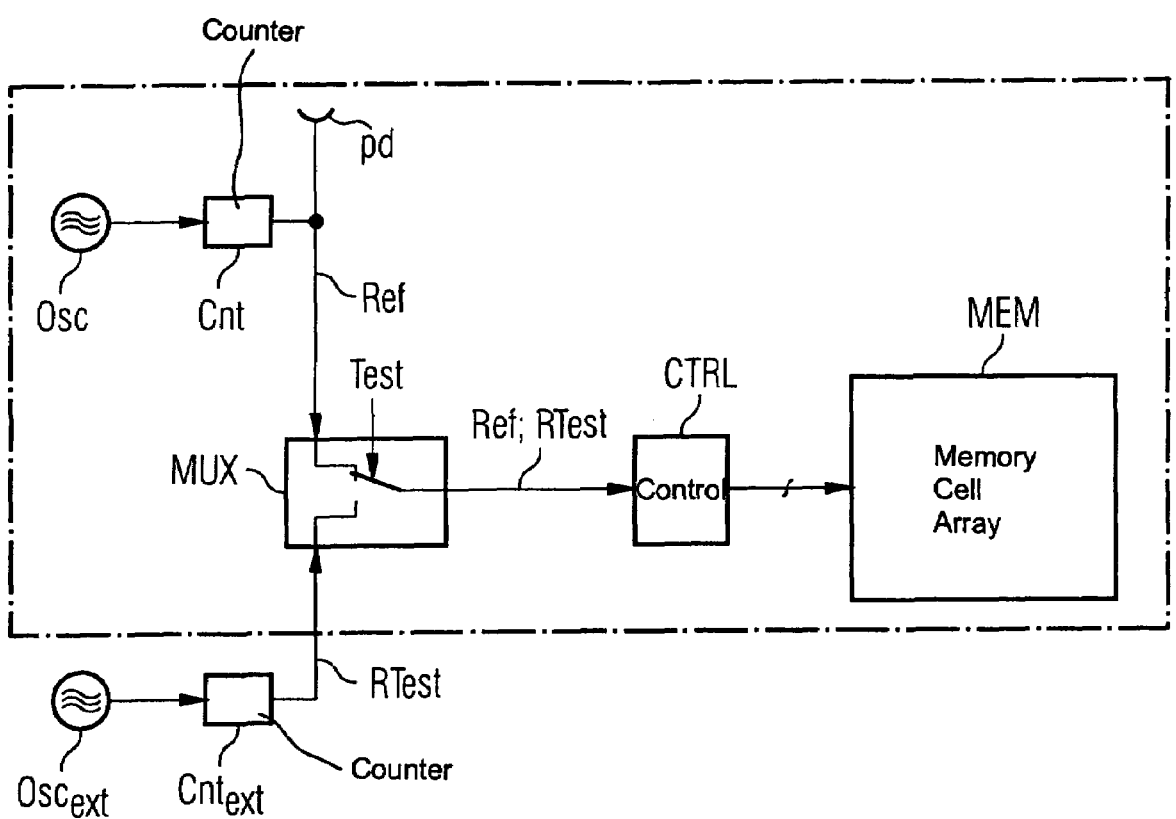

US 7,437,629 B2

METHOD FOR CHECKING THE REFRESH FUNCTION OF AN INFORMATION MEMORY

BACKGROUND OF THE INVENTION

Field of the Invention

The present invention relates to a method for checking the refresh function of a memory for storing information.

Particular types of memories for storing information, particularly those with memory cells of the dynamic type, require "refresh operations" within prescribed periods of time. These operations involve the information stored in a memory cell briefly being read out and written back to the cell in unchanged form. Without such refresh operations, the memory cells would lose the information stored in them within a very short time. The reason for such loss can be found in the construction of the memory cells: the information stored in them is being reduced constantly by unavoidable leakage currents, which means that, in the absence of the refresh operations, it can no longer be recognized as the original information upon reading after a certain time. This is general knowledge in relevant technical circles.

For such reasons, many of these memories, today, have a refresh device that performs the refresh operation automatically or upon request based upon prescribed criteria. Because such refresh operations require a finite time to be executed, there are various ways of connecting the sequence of these refresh operations to the normal mode of the memory in a suitable manner over time. Like all the other components of such memories, the operation of these refresh devices also needs to be tested. By way of example, German Published, Non-Prosecuted Patent Application DE 100 04 958 A1, corresponding to United States Patent Publication 2001/027,541 A1 to Richter et al., discloses a method for testing the refresh device in a memory for storing information. A drawback of this method is that, when an error occurs during testing, it is not known if one or more components of the tested refresh device is/are faulty.

SUMMARY OF THE INVENTION

It is accordingly an object of the invention to provide a method for checking the refresh function of an information memory that overcomes the hereinafore-mentioned disadvantages of the heretofore-known devices and methods of this general type and that permits more accurate inferences about the causes of malfunctions that arise.

With the foregoing and other objects in view, there is provided, in accordance with the invention, a method for checking the refresh function of a memory having a refresh device, including determining if refresh request pulses are being produced on the memory and at what intervals of time the refresh request pulses are being produced on the memory, supplying a control unit of the memory with refresh test pulses produced outside the memory instead of supplying the control unit with the refresh request pulses, and checking the refresh device of the memory utilizing the refresh test pulses.

In accordance with another mode of the invention, the control unit controls the checking of the refresh device.

In accordance with a further feature of the invention, the refresh test pulses and the refresh request pulses are supplied to a multiplex device. Preferably, the refresh test pulses and the refresh request pulses are supplied to the control unit through a multiplex device.

In accordance with an added feature of the invention, a multiplex device is connected to the control unit and the refresh test pulses and the refresh request pulses are supplied to the control unit through the multiplex device.

In accordance with a concomitant feature of the invention, the multiplex device is controlled with a test signal.

Other features that are considered as characteristic for the invention are set forth in the appended claims.

Although the invention is illustrated and described herein as embodied in a method for checking the refresh function of an information memory, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

The FIGURE is a block and schematic circuit diagram of individual elements of a memory for storing information according to the invention and a flow of signals significant to the invention.

DESCRIPTION OF THE PREFERRED EMBODIMENTS

Referring now to the single FIGURE of the drawing, elements of significance to the present invention that are part of the memory to be checked are shown within a dash-dot line. These elements are a (normally freely cycling) internal oscillator Osc, a counter Cnt, a multiplex device MUX, a control unit CTRL, and a memory cell array MEM containing the memory cells to be refreshed and containing a refresh device. The refresh device can be of the type presented in the aforementioned German Published, Non-Prosecuted Patent Application DE 100 04 958 A1, corresponding to United States Patent Publication 2001/027,541 A1 to Richter et al., for example. A pad pd on the memory is also indicated. With the exceptions of the pad pd and the multiplex device MUX, all the elements shown are also already present in a memory that cannot be tested using the inventive method. This means that only very little involvement and, in particular, very little additional chip area are required in order to equip a conventional memory such that its refresh function can be tested using the method according to the invention. Outside of the memory, there are also an external, freely cycling oscillator $Osc_{ext}$ and an external counter $Cnt_{ext}$, which are used for carrying out the inventive method. Both can be part of a test machine, for example. There are also known (ordinary) instances of application of memories in which an external oscillator is also already available for the normal mode of the memory. Such an oscillator can, then, naturally be used as the aforementioned external, freely cycling oscillator $Osc_{ext}$.

The inventive method, now, proceeds as set forth in the following text.

In a first step, it is ascertained whether or not refresh request pulses Ref are being produced on the memory, which can be an integrated semiconductor memory of the DRAM type, for example. If the memory is intact, these refresh request pulses Ref are used in the normal mode to trigger a refresh operation. In practice, there are great demands on these refresh request pulses Ref: first, they need to observe a prescribed interval of time from one another. If this interval is exceeded, the guaranteed "retention time" (=minimum period of time, guaranteed by the memory manufacturer, within which stored information will not "be lost") is exceeded, i.e., necessary refresh operations do not take place in time or in full, which can result in data losses. Secondly, such refresh request pulses Ref should not appear all too often either because refresh operations would, then, be performed more often than is technically necessary, resulting in unnecessarily increased power consumption. Consequently, the first step ascertains not just if the refresh request pulses Ref actually appear, but also at what interval of time from one another they occur. Thus, if this test ascertains that the refresh request pulses Ref are actually appearing and also at the right time, then there is already a firm first partial result that states that a first prerequisite for the performance of regular refresh operations in the normal mode of the information memory is satisfied.

The drawing shows a pad pd on the memory that can be used to perform the afore-mentioned test on the refresh request pulses Ref. This pad pd can also be connected to a pin on a chip that contains the memory, which means that the refresh request pulses Ref are available on the pin (outside of the chip) and can, thus, also be picked off. If test needles or test electrodes of sufficiently small dimensions are available, the afore-mentioned ascertainment can also be performed directly on an appropriate interconnect in the memory. In such a case, the pad pd becomes unnecessary.

In the normal mode of a memory, the usual refresh operation is performed such that a circuit that can be referred to generally as a control unit CTRL is supplied with the refresh request pulses Ref. The control unit CTRL (which provides important control signals and/or data signals for operating the memory cell array MEM together with its refresh device and supplies the signals to the memory cell array MEM) modifies a portion of these signals when a refresh request pulse Ref is currently present such that a single cycle does not just involve a memory cell being read (or written to, depending on the request) in regular fashion, but, rather, memory cells (usually all the memory cells along one word line) are also refreshed. The latter generally occurs within the cycle before reading or writing.

In the case of the inventive method, on the other hand, the control unit CTRL is supplied with refresh test pulses RTest instead of being supplied with the refresh request pulses Ref, the refresh test pulses RTest being, in turn, supplied to the information memory externally, for example, using an external, freely cycling oscillator $Osc_{ext}$ and an external counter $Cnt_{ext}$ connected thereto. This means that precisely a desired number of refresh test pulses RTest can be set per unit time, and, hence, their interval of time from one another; during testing, there is no dependence on the number of refresh request pulses Ref per unit time that is implemented on the memory itself.

It is possible to change over between supply of the refresh request pulses Ref and supply of the refresh test pulses RTest using a multiplex device MUX. This can be in a form such that, in the memory's normal mode, it has an "idle" setting in which the refresh request pulses Ref are connected through to the control unit CTRL, while in the test mode a test signal Test supplied to the memory externally is applied with a prescribed signal level to the multiplex device MUX to control it as appropriate, i.e., to change it over. The test signal Test can also be a given an electrical potential that is already provided as such on the memory independently of a test mode and can be applied to the multiplex device MUX during testing.

While the refresh test pulses RTest are being supplied to the control unit CTRL, the refresh device's operation is checked, under the control of the control unit CTRL. It is advantageous in this case if this check is carried out as disclosed in the aforementioned German Published, Non-Prosecuted Patent Application DE 100 04 958 A1, corresponding to United States Patent Publication 2001/027,541 A1 to Richter et al.

The inventive method, thus, provides a simple way—with almost no involvement—of establishing, an from additional area on the memory, whether or not the memory's individual components involved in the appearance of refresh operations (that is to say, in the present case: memory-internal oscillator Osc with downstream counter Cnt, control unit CTRL, and the refresh device, itself) are operating correctly.

We claim:

1. A method for checking the refresh function of a memory having a refresh device, which comprises
    determining if refresh request pulses are being produced on the memory and at what intervals of time the refresh request pulses are being produced on the memory by detecting the refresh request pulses at a pad;
    supplying refresh test pulses produced outside the memory using a freely cycling external oscillator and an external counter to a control unit of the memory, via a multiplex device, the refresh test pulses being supplied to the control unit instead of the refresh request pulses, the multiplex device being controlled by a test signal; and
    checking the refresh device of the memory utilizing the refresh test pulses.

2. The method according to claim 1, which further comprises controlling the checking of the refresh device with the control unit.

3. The method according to claim 2, which further comprises supplying the refresh test pulses and the refresh request pulses to the multiplex device.

4. The method according to claim 2, which further comprises supplying the refresh test pulses and the refresh request pulses to the control unit through the multiplex device.

5. The method according to claim 2, which further comprises:
    connecting the multiplex device to the control unit; and
    supplying the refresh test pulses and the refresh request pulses to the control unit through the multiplex device.

6. The method according to claim 1, which further comprises supplying the refresh test pulses and the refresh request pulses to the multiplex device.

7. The method according to claim 1, which further comprises supplying the refresh test pulses and the refresh request pulses to the control unit through the multiplex device.

8. The method according to claim 1, which further comprises:
    connecting the multiplex device to the control unit; and
    supplying the refresh test pulses and the refresh request pulses to the control unit through the multiplex device.

* * * * *